(12) United States Patent
Crocker et al.

(10) Patent No.: US 9,950,926 B2
(45) Date of Patent: Apr. 24, 2018

(54) METHOD FOR PRODUCTION OF GERMANIUM NANOWIRES ENCAPSULATED WITHIN MULTI-WALLED CARBON NANOTUBES

(75) Inventors: Mark Crocker, Georgetown, KY (US); Rodney Andrews, Lexington, KY (US); Arumugam Pandurangan, Chennai (IN); Dali Qian, Lexington, KY (US)

(73) Assignee: THE UNIVERSITY OF KENTUCKY RESEARCH FOUNDATION, Lexington, KY (US)

( * ) Notice: Subject to any disclaimer, the term of this patent is extended or adjusted under 35 U.S.C. 154(b) by 905 days.

(21) Appl. No.: 12/942,396

(22) Filed: Nov. 9, 2010

(65) Prior Publication Data

US 2011/0111227 A1    May 12, 2011

Related U.S. Application Data

(60) Provisional application No. 61/259,429, filed on Nov. 9, 2009.

(51) Int. Cl.
*B32B 9/00*  (2006.01)
*B82Y 30/00*  (2011.01)
*B82Y 40/00*  (2011.01)

(52) U.S. Cl.
CPC ............ *B82Y 30/00* (2013.01); *B82Y 40/00* (2013.01); *Y10T 428/2964* (2015.01); *Y10T 428/30* (2015.01)

(58) Field of Classification Search
CPC .. C01B 2202/00; C01B 2202/10; C01B 31/22
USPC ........... 428/408; 423/448; 252/500; 977/742
See application file for complete search history.

(56) References Cited

U.S. PATENT DOCUMENTS

| | | | |
|---|---|---|---|
| 5,916,642 A | * | 6/1999 | Chang ............................. 29/509 |
| 6,090,363 A | * | 7/2000 | Green et al. ............... 423/447.1 |
| 6,946,369 B2 | | 9/2005 | Mazen et al. |
| 7,141,488 B2 | | 11/2006 | Woelk et al. |
| 7,160,531 B1 | | 1/2007 | Jacques et al. |
| 7,391,074 B2 | | 6/2008 | Cohen |
| 7,446,335 B2 | | 11/2008 | Kortshagen et al. |
| 7,504,078 B1 | | 3/2009 | Jacques et al. |
| 7,591,871 B1 | | 9/2009 | Gerung et al. |
| 2002/0193040 A1 | * | 12/2002 | Zhou ............................... 445/51 |

(Continued)

OTHER PUBLICATIONS

Filling Carbon Nanotubes with metal by arc-discharge method; the key role of sulfur; Demoncy, Eur. Phys. J. B 4. 147-157 (1998).*

(Continued)

*Primary Examiner* — Daniel H Miller
(74) *Attorney, Agent, or Firm* — King & Schickli, PLLC

(57) ABSTRACT

A method is provided for producing germanium nanowires encapsulated within multi-walled carbon nanotubes. The method includes the steps of performing chemical vapor deposition using a combined germanium and carbon source having a general formula of $GeR_{(4-x)}L_x$, where x=0, 1, 2, or 3; R is selected from a group consisting of alkyl, cycloalkyl or aryl and L=hydrogen, halide or alkoxide and growing germanium nanowires encapsulated within multi-walled carbon nanotubes on a substrate. A reaction product of that method or process is also provided.

12 Claims, 14 Drawing Sheets

(56) References Cited

U.S. PATENT DOCUMENTS

2005/0064322 A1    3/2005   Babich et al.
2007/0275563 A1   11/2007  Babich et al.

OTHER PUBLICATIONS

Single step synthesis of germanium nanowires encapsulated within multi-walled carbon nanotubes; Pandurangan, Carbon 47 (2009) 1708-1714.*

Pandurangan, A. et al., Single-Step Synthesis of Germanium Nanowires Encapsulated within Multi-walled Carbon Nanotubes, Carbon, vol. 47, Issue 7, Jun. 2009, pp. 1708-1714.

Qian, Dali et al, Synthesis of Germanium/Multi-walled Carbon Nanotube Core-Sheath Structures via Chemical Vapor Deposition, Nanowires Science and Technology, ISBN 978-953-7619-899-3, pp. 113-130, Feb. 2010, Intech, Croatia.

* cited by examiner

METHOD FOR PRODUCTION OF GERMANIUM NANOWIRES ENCAPSULATED WITHIN MULTI-WALLED CARBON NANOTUBES

This application claims the benefit of U.S. Provisional Patent Application Ser. No. 61/259,429 filed on 9 Nov. 2009, the entire disclosure of which is incorporated herein by reference.

TECHNICAL FIELD AND INDUSTRIAL APPLICABILITY OF THE INVENTION

The present invention relates generally to the field of nanotechnology and, more particularly, to a method of producing germanium nanowires encapsulated within multi-walled carbon nanotubes as well as to such nanowires as produced by that method.

BACKGROUND OF THE INVENTION

Nanostructures such as nanotubes, nanowires and nanobelts are characterized by novel electronic and optical properties intrinsically associated with their load dimensionality and the quantum confinement effect. Such nanostructures have potential applications in nanoelectronics, advanced composites, field emission devices, sensors, probes, optics and optoelectronics.

Silicon nanowires are of great technological importance in microelectronics. Silicon nanowires exhibit significant differences in physical and chemical properties from bulk silicon. Compared to silicon, germanium nanostructures are of particular interest since the exciton Bohr radius of bulk germanium is larger than that of silicon. This results in more prominent quantum confinement effects. Germanium also offers the advantage of lower processing temperatures with easier integration into conventional devices. Germanium also has much higher electron and hole mobility than silicon making germanium the preferred material for electronic devices scaled down to the Sub-100 nm regime.

Several growth methods are known in the art for the synthesis of germanium nanowires. These include laser ablation, thermal evaporation, super critical fluid synthesis, liquid-state synthesis, molecular beam epitaxy and chemical vapor deposition (CVD). CVD has been the most widely employed of these synthesis methods to grow germanium nanowires from suitable catalysts and germanium precursors such as $GeH_4$, $Ge_2H_6$, $Ge(C_5H_5)_2$, $C_{12}H_{12}Ge$, $Ge$—$GeO_2$ and $Ge$—$GeI_4$. In most of the prior art CVD methods as well as the methods employing thermal evaporation of germanium powders, gold nanoparticles have been typically selected as the catalyst for germanium nanowire growth via the vapor-liquid-solid (VLS) mechanism. This is due to the low utectic temperature of the Ge—Au alloy. Other low melting point metals/alloys that have been employed as the catalyst include Al, Cu, Cu—Ni and Fe(Ge).

Untreated germanium nanowires are reported to oxidize upon exposure to ambient conditions. Since germanium oxide coatings possess unfavorable electronic properties such nanowire oxidation degrades the performance of any nanodevice incorporating germanium nanowires. Accordingly, it is necessary to protect any germanium nanowires from oxidation.

One way to control or limit germanium oxidation is by carbon-encapsulation of the carbon-germanium nanowires. This has previously been done using a chemical vapor deposition (CVD) technique. Specifically, a supported gold catalyst was employed to catalyze the growth of the germanium nanowires which were then dispersed on an amorphous carbon film and annealed. This resulted in the encapsulation of the nanowires by well defined, curved graphene sheets. The presence of gold nanoparticles or residual catalysts on the surface of the nanowires is instrumental in initiating graphene sheet formation. Other methods which have been employed for the preparation of germanium/carbon core sheet nanostructures include the arc discharge synthesis of carbon nanotubes in the presence of germanium metal and the deposition of graphitic coatings on preformed germanium nanowires by their treatment with organic vapors at 700 and 900 degrees C.

The carbon arc discharge method, initially used for producing C60 fullerenes, is the most common and perhaps easiest way to produce multi-walled carbon nanotubes (MWCNTs), as it is rather simple. This method creates MWCNTs through arc-vaporization of two carbon rods placed end to end, separated by approximately 1 mm, in an enclosure that is usually filled with inert gas at low pressure. A direct current of 50 to 100 A, driven by a potential difference of approximately 20 V, creates a high temperature discharge between the two electrodes. The discharge vaporizes the surface of one of the carbon electrodes, and forms a small rod-shaped deposit on the other electrode. In order to produce MWCNTs filled with Ge (or indeed another element), a small cavity is bored out in the anode and packed with the desired element.

A disadvantage of the carbon arc discharge method is the fact that is produces a complex mixture of components which requires further purification, i.e., to separate the MWCNTs from the soot and the residual catalytic metals present in the crude product. Indeed, typical MWCNT yields do not exceed 50 weight percent, while single-walled carbon nanotube (SWCNT) yields can reach about 75 percent. This is also apparent for the Ge-filled MWCNTs reported by Dai et al. and by Loiseau et al. Low resolution TEM images of the Ge-filled MWCNTs obtained by Dai et al. clearly show the presence of significant amounts of spherical soot particles intimately mixed with the filled MWCNTs. Similarly, medium resolution TEM images reported by Loiseau et al. for MWCNTs filled with a variety of elements (including Ni, Sm, Dy, S, Sb, Pd, and Co) reveal the presence of amorphous carbon particles mixed with the nanotubes. This presents a clear disadvantage for the production of Ge-filled MWCNTs for microelectronics applications since purification of the crude product would be required.

The present invention is a simple one or two step synthesis method using a combined germanium and carbon source. The nanowires resulting from the present invention are characterized by high thermal stability and high electrical conductivity. In contrast to the prior CVD methods, the current method is catalyst free while the reaction product is clean and pure, incorporating greater than 95 weight percent germanium nanowires encapsulated in MWCNTs and less than 5 weight percent amorphous material.

SUMMARY OF THE INVENTION

In accordance with the purposes of the present invention as described herein, a method is provided for the production of germanium nanowires encapsulated within multi-walled carbon nanotubes. The method may be broadly described as comprising the steps of performing chemical vapor deposition using a combined germanium and carbon source having a general formula of $GeR_{(4-x)}L_x$ (where x=0, 1, 2 or 3 and R is selected from a group consisting of alkyl, cycloalkyl or aryl and L=hydrogen, halide or alkoxide) and growing the germanium nanowires encapsulated within the multi-walled carbon nanotubes on a substrate. In a particularly useful embodiment, the combined germanium and carbon source has a general formula GeR$_4$ where R is selected from alkyl, cycloalkyl or aryl. In yet another particularly useful embodiment, the combined germanium and carbon source is phenyltrimethylgermane.

The method may be a simple one step process using a carrier gas selected from a group consisting of nitrogen, argon, helium, hydrogen and mixtures thereof. Alternatively, the method may include a two step process including first feeding said combined germanium and carbon source under an N$_2$ carrier gas to form multi-walled carbon nanotube sheaths on channel walls of a template and then feeding said combined germanium and carbon source under a hydrogen and argon carrier gas mixture to fill the multi-walled carbon nanotube sheaths with germanium nanowires.

Alternatively, the method for the production of germanium nanowires encapsulated within multi-walled carbon nanotubes may be described as comprising the steps of dissolving a combined germanium and carbon source in a liquid hydrocarbon solvent to form a feed solution, dispersing the feed solution into a stream of a carrier gas, introducing the feed solution into a reactor through a reactor inlet, volatilizing the feed solution in the reactor and growing germanium nanowires encapsulated within multi-walled carbon nanotubes on a substrate in the reactor. The germanium and carbon source has a general formula of GeR$_{(4-x)}$L$_x$ as described above.

The method may further include the step of selecting the carrier gas from a group including nitrogen, argon, helium, hydrogen and mixtures thereof. The radical R in the general chemical formula of the combined germanium and carbon source may be selected from the group consisting of phenyl, methyl, ethyl, n-propyl, isopropyl, n-butyl, tert-butyl, vinyl, allyl and cyclopentadienyl and mixtures thereof. In one particularly useful embodiment the combined germanium and carbon source is phenyltrimethylgermane. In yet another particularly useful embodiment the phenyltrimethylgermane is mixed with ferrocene in the feed solution.

The method includes providing the combined germanium and carbon source in the reactor at a concentration of between about 1,000 to about 10,000 ppm. In one useful embodiment the combined germanium and carbon source is provided at a concentration of between about 1,850 to about 3,850 ppm. In another it is provided at a concentration of about 2,850 ppm. The method includes maintaining the reactor at a temperature of between about 800 and about 1,000 degrees C.

The method also includes using a substrate made from a material selected from a group consisting of quartz, anodized aluminum oxide, sapphire, aluminum coated quartz, aluminum coated silicon and mixtures thereof. The method may also include growing the encapsulated germanium nanowires in an array by depositing germanium and carbon from the combined germanium and carbon source within the pores of a template.

In accordance with yet another aspect of the present invention, a reaction product from a process of growing germanium nanowires is provided. The reaction product is characterized by comprising greater than 60, 70, 80, 90 and even 95 weight percent germanium nanowires encapsulated in multi-walled carbon nanotubes and, respectively, less than 40, 30, 20, 10, and even 5 weight percent amorphous material in the absence of performing any purification step. The nanowire has a length of between about 6 and about 50 µm and an overall diameter of between about 50 and about 300 nm. The nanowire in the reaction product includes between about 95 and about 100 weight percent germanium and between about 5 and about 0 weight percent carbon. In one particularly useful embodiment the core includes between about 50 and about 99 weight percent germanium and between about 50 and about 1 weight percent iron.

In the following description there is shown and described several different embodiments of the invention, simply by way of illustration of some of the modes best suited to carry out the invention. As it will be realized, the invention is capable of other different embodiments and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated herein and forming a part of the specification, illustrate several aspects of the present invention and together with the description serve to explain certain principles of the invention. In the drawings.

Reference will now be made in detail to the present preferred embodiment of the invention, examples of which are illustrated in the accompanying drawings.

DETAILED DESCRIPTION OF THE PREFERRED EMBODIMENTS OF THE INVENTION

Figure 1:
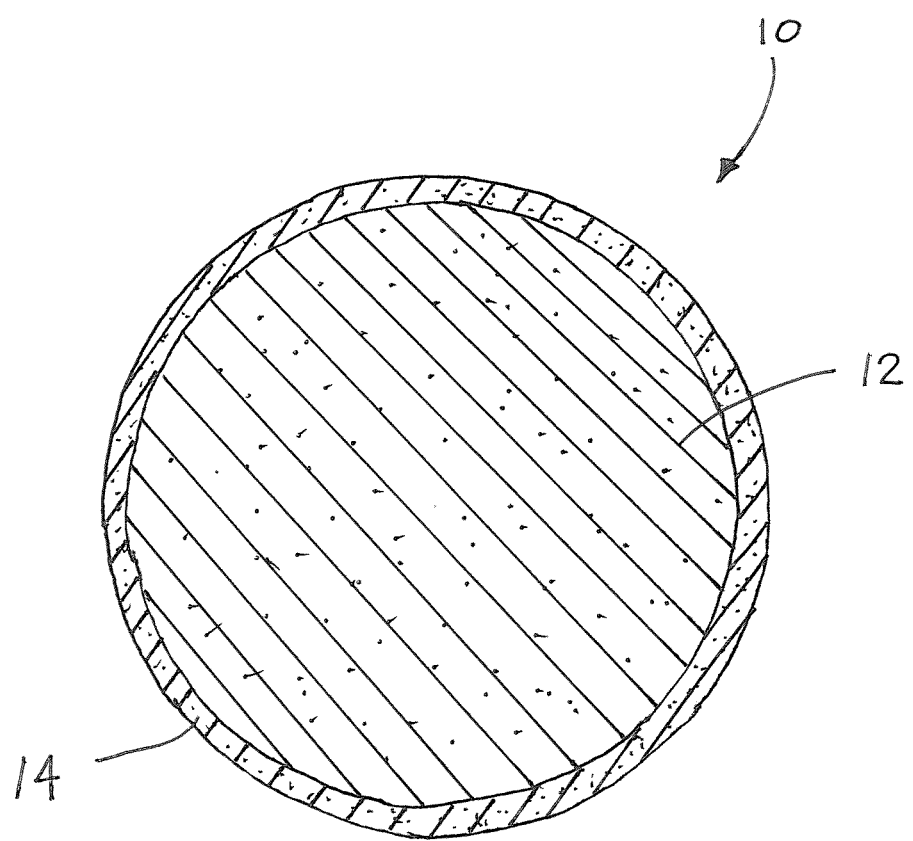
FIG. 1 is a cross sectional view of a nanowire incorporating a germanium core surrounded by a multi-walled carbon nanotube sheath.

Reference is now made to FIG. 1 which is a cross sectional illustration of a nanowire 10 incorporating a germanium core 12 surrounded by a multi-walled carbon nanotube (MWCNT) sheath 14 as produced in accordance with the method of the present invention. That method for the production of germanium nanowires encapsulated within MWCNTs may be broadly defined as comprising the steps of (1) performing chemical vapor deposition using a combined germanium and carbon source and (2) growing germanium nanowires encapsulated within multi-walled carbon nanotubes on a substrate. The germanium and carbon source has a general formula of $GeR_{(4-x)}L_x$, where x=0, 1, 2, or 3; R is selected from a group consisting of alkyl, cycloalkyl or aryl and L=hydrogen, halide or alkoxide. In a particularly useful embodiment the combined germanium and carbon source has a general formula of $GeR_4$ where R is selected from a group consisting of alkyl, cycloalkyl or aryl. In yet another particularly useful embodiment of the present invention the combined germanium and carbon source comprises phenyltrimethylgermane. The phenyltrimethylgermane may be utilized neat or mixed with ferrocene.

The method of the present invention for the production of germanium nanowires encapsulated within MWCNTs may be more specifically defined as comprising the dissolving of the combined germanium and carbon source in a liquid hydrocarbon solvent to form a feed solution, dispersing the feed solution into a stream of carrier gas, introducing the feed solution in the carrier gas into a reactor through a reactor inlet, volatilizing the feed solution in the reactor and growing germanium nanowires encapsulated within MWCNTs on a substrate in the reactor. The liquid hydrocarbon solvent may be, for example, pyridine, benzene, toluene, xylene or any liquid hydrocarbon solvent appropriate for dissolving the combined germanium and carbon source. The combined germanium and carbon source to solvent ratio should be between 1:5 and 1:0 and more preferably between 1:2 and 1:0. The carrier gas may be selected from a group including nitrogen, argon, helium, hydrogen and mixtures thereof. Mixtures of from about 5 to about 30 percent hydrogen and the remainder argon are particularly useful.

As noted above, the germanium and carbon source has a general formula of $GeR_{(4-x)}L_x$ where x=0, 1, 2 or 3; R is selected from a group consisting of alkyl, cycloalkyl or aryl and L=hydrogen, halide or alkoxide. In some particularly useful embodiments of the invention, the radical R is selected from a group of radicals consisting of phenol, methyl, ethyl, vinyl, n-propyl, iso-propyl, allyl, n-butyl, tert-butyl, cyclopentadienyl and mixtures thereof.

The method further includes providing the combined germanium and carbon source in the reactor at a concentration of between about 1000 to about 10,000 ppm. In another particularly useful embodiment of the invention the method includes providing the combined carbon and germanium carbon source in the reactor at a concentration of between about 1,850 to about 3,850 ppm. In still another particularly useful embodiment of the present invention the method includes providing the combined germanium and carbon source in the reactor at a concentration of about 2,850 ppm. In addition, the method includes maintaining the reactor at a temperature of between about 700 and about 1,000 degrees C. and more typically between about 800 and about 900 degrees C. during the production process.

The method further includes using a substrate made from a material selected from a group consisting of quartz, anodized aluminum oxide, sapphire, aluminum coated quartz, aluminum coated silicon and mixtures thereof. In one particularly useful embodiment the method includes growing the encapsulated germanium nanowires in an array by depositing germanium and carbon from the combined germanium and carbon source within pores in a template such as an anodized aluminum oxide template. Using phenyltrimethylgermane as the combined germanium and carbon source is particularly beneficial when growing a germanium nanowire array. The phenyltrimethylgermane may be used (a) neat, (b) mixed with a solvent such as xylene or (c) it may be mixed with a doping agent such as ferrocene including anywhere from between about 99 weight percent to about 50 weight percent phenyltrimethylgermane with the remainder ferrocene. In the case of (c), a sufficient amount of a hydrocarbon solvent such as pyridine, xylene, toluene or benzene is preferably added to ensure dissolution of the ferrocene.

The reaction product resulting from the process of the present invention for growing germanium nanowires encapsulated within multi-walled carbon nanotubes has a number of distinct characteristics. Specifically, the reaction product obtained directly from the process is characterized by comprising greater than 60 weight percent germanium nanowires encapsulated in multi-walled carbon nanotubes and less than 40 weight percent amorphous material. These purity numbers are attained in the absence of performing any purification step. In fact, the actual product may be characterized by comprising greater than 70, 80, 90 and even 95 weight percent germanium nanowires encapsulated in multi-walled carbon nanotubes and less than, respectively, 30, 20, 10 and even 5 weight percent amorphous material in the absence of performing any purification step. This pure, clean product is particularly advantageous for ultimate use in nanostructures including particularly those for nanoelectronic applications relating to, but not limited to, advanced composites, field emission devices, sensors, probes, optics and optoelectronics.

The multi-walled carbon nanotubes that form the sheath 14 around the germanium core 12 have a thickness of between about 5 and about 10 mm. The nanowire itself has a length of between about 6 and about 50 µm and an overall diameter of between about 50 and about 300 nm. Particularly useful embodiments of nanowires prepared using the present method have a length of between about 10 and about 50 µm and more preferably between about 20 and about 50 µm and an overall diameter of between about 50 and about 300 nm. The nanowires also include between about 95 and about 100 weight percent germanium and between about 5 and about 0 weight percent carbon. Typically, the nanowires include about 97 weight percent germanium and about 3 weight percent carbon. Where the combined germanium and carbon source is phenyltrimethylgermane mixed with ferrocene, the core 12 includes between about 50 and about 99 weight percent germanium and between about 50 and about 1 weight percent iron. The following synthesis and examples are provided to further illustrate the invention, but it is not to be considered as limited thereto.

Example 1

Preparation of Ge-Filled MWCNTs

The two-zone furnace employed for the CVD preparation consisted of a quartz tube reactor (with inner diameter of 28 mm) and a flat quartz slide inserted at the reaction zone for additional deposition surface. Neat phenyltrimethylgermain (PTMG) was injected into the preheat zone of the reactor at a rate of 1 ml/h. After volatilization in the preheat zone (~250° C.), the PTMG was carried into the reaction zone of the furnace, maintained at 800° C., by a 10% $H_2$/Ar sweep gas (750 $cm^3$/min flow rate). The entire system was maintained at a slight positive pressure (~0.75 kPa) versus atmospheric pressure. Typical CVD runs were of 2 h duration, after which the material deposited on the quartz slide was collected for analysis.

Characterizations

Scanning electron microscopy (SEM) was performed using a Hitachi S-2700 microscope equipped with a $LaB_6$ electron gun, as well as a field emission Hitachi S-4800 high resolution microscope. Transmission electron microscopy (TEM), high-resolution TEM (HRTEM), scanning transmission electron microscopy (STEM) and energy dispersive X-ray spectroscopy (EDS) were conducted using a JEOL 2010 field emission TEM operated at 200 kV. Quantitative EDS analysis was perform under STEM mode by locating the analytical probe at the center position of the encapsulated Ge nanowires. EDS spectra were collected using an Oxford Analytical detector. Spectra were background subtracted and C/Ge peak fitting was performed using the EsVision microanalysis system. The error on the resulting Ge and C concentrations is estimated at not more than +/−10%.

Powder X-ray diffraction (XRD) measurements were performed on a Phillips X'Pert diffractometer using Cu $K_\alpha$ radiation ($\lambda$=1.5406 Å) and a step size of 0.02°. X-ray photoelectron spectroscopy (XPS) analyses were performed on a PHI 5600 LS instrument, using a non-monochromatic Al source. The analysis area was 1×3 mm. The C 1 s line (285.0 eV) was employed as a binding energy standard. Thermogravimetric analysis (TGA) was performed using a TA Instruments TGA Q500 system. Samples were heated in a flow of air (50 cm$^3$/min) at 10° C./min from room temperature to 1000° C.

Figure 2A:
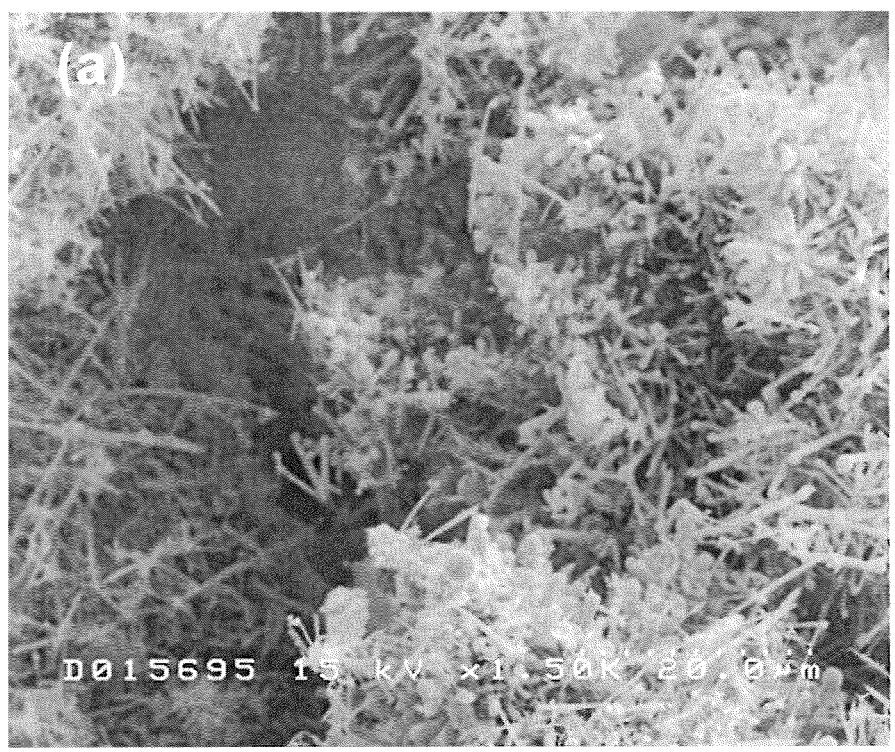
FIG. 2a is a scanning electron micrograph (SEM) image of Ge-filled MWCNTs synthesized at 800° C.
Figure 2B:
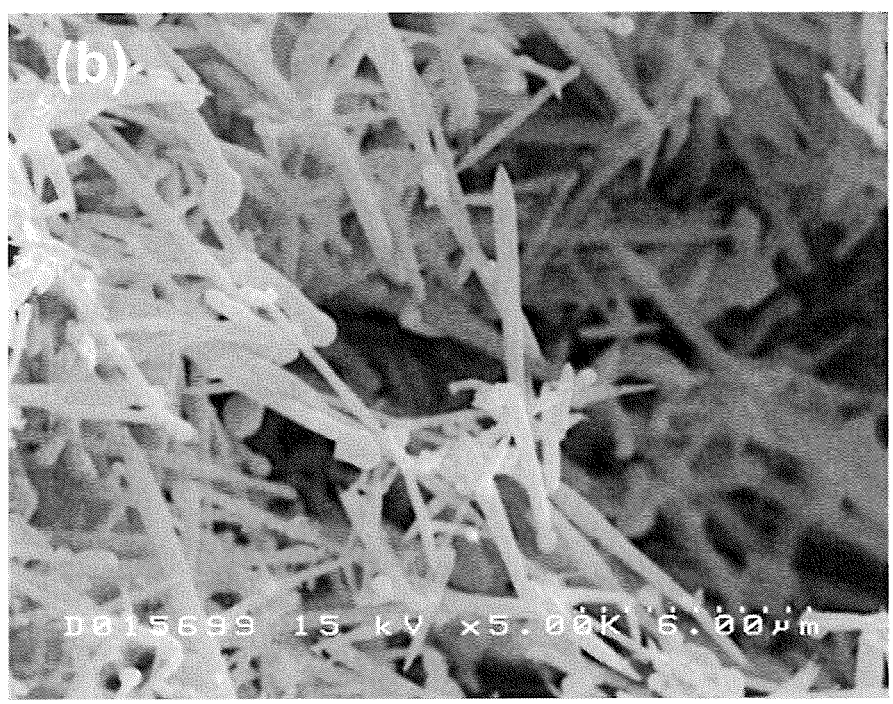
FIG. 2b is a higher magnification SEM image showing MWCNT tips.

Representative scanning electron micrographs of the material prepared at 800° C. are shown in FIG. 2. These show the sample to consist mainly of nanowires, possessing diameters of less than 500 nm (see FIG. 2b). The nanowires appear smooth, with little evidence of metal cluster formation. Furthermore, from FIG. 2 and other micrographs, it is apparent that the as-synthesized nanowires are largely free from amorphous carbon and possess large aspect ratios, the typical length being in the order of 10 μm. In contrast, syntheses carried out at 700° C., 900° C. and 1000° C. did not yield Ge-containing nanowires. At 700° C. decomposition of the precursor appears to be incomplete; consequently, only a few short wires are formed. Increase of the temperature above 800° C. results in the formation of amorphous carbon, with Ge nanoparticle formation being favored over the formation of nanowires.

Figure 3A:
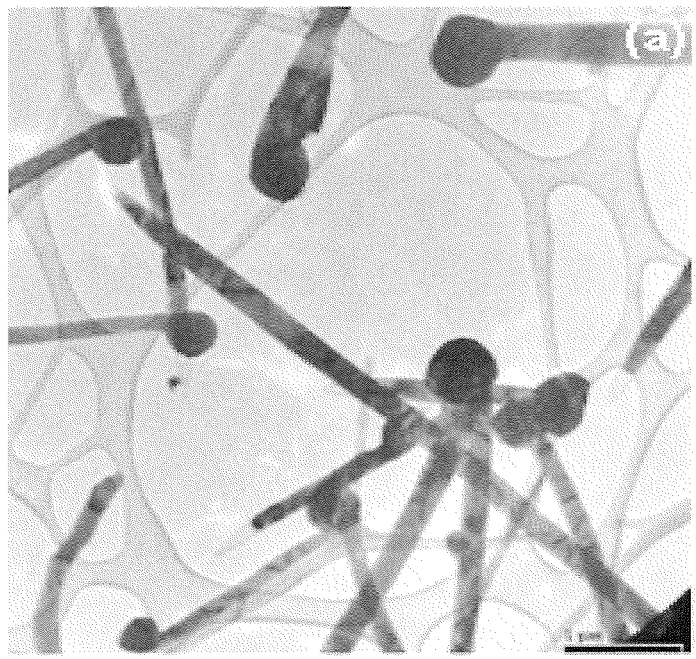
FIGS. 3a-3e are transmission electron micrograph (TEM) images of the Ge-filled MWCNT reaction product shown in FIGS. 2a and 2b.

More detailed microstructural investigations were performed in TEM and STEM/EDS modes, the latter using a 1 nm analytical probe. As revealed by TEM, the product obtained at 800° C. (hereafter denoted as Ge@MWCNT/800) consists of crystalline Ge nanowires, encapsulated in a thin MWCNT sheath. Typical TEM images at low magnification (see FIGS. 3a and 3b) reveal a pin-like morphology. TEM images at higher magnification (FIG. 3d, 3e) show that the Ge nanowires consist of well crystallized Ge cores which are completely encapsulated by the sheath-like MWCNTs possessing a thickness of 5-10 nm. Ge incorporation within the graphene sheets of the MWCNTs is not observed according to EDS analysis under STEM mode. Quantitative EDS analysis of the tube cores (see FIG. 4) indicates a composition of 95% Ge and 5% C (atom %). Given the existence of 5-10 nm thick of graphene (C) layers covering the Ge core at the analytical probe position, we can reasonably conclude that the core consists of pure Ge, as supported by HRTEM observations that show clear fringes corresponding to single crystal Ge (see FIG. 3e). Furthermore, EDS analysis confirmed that the near spherical heads of the nanowires consist of over 97 atom % Ge (the balance being C).

Figure 5A:
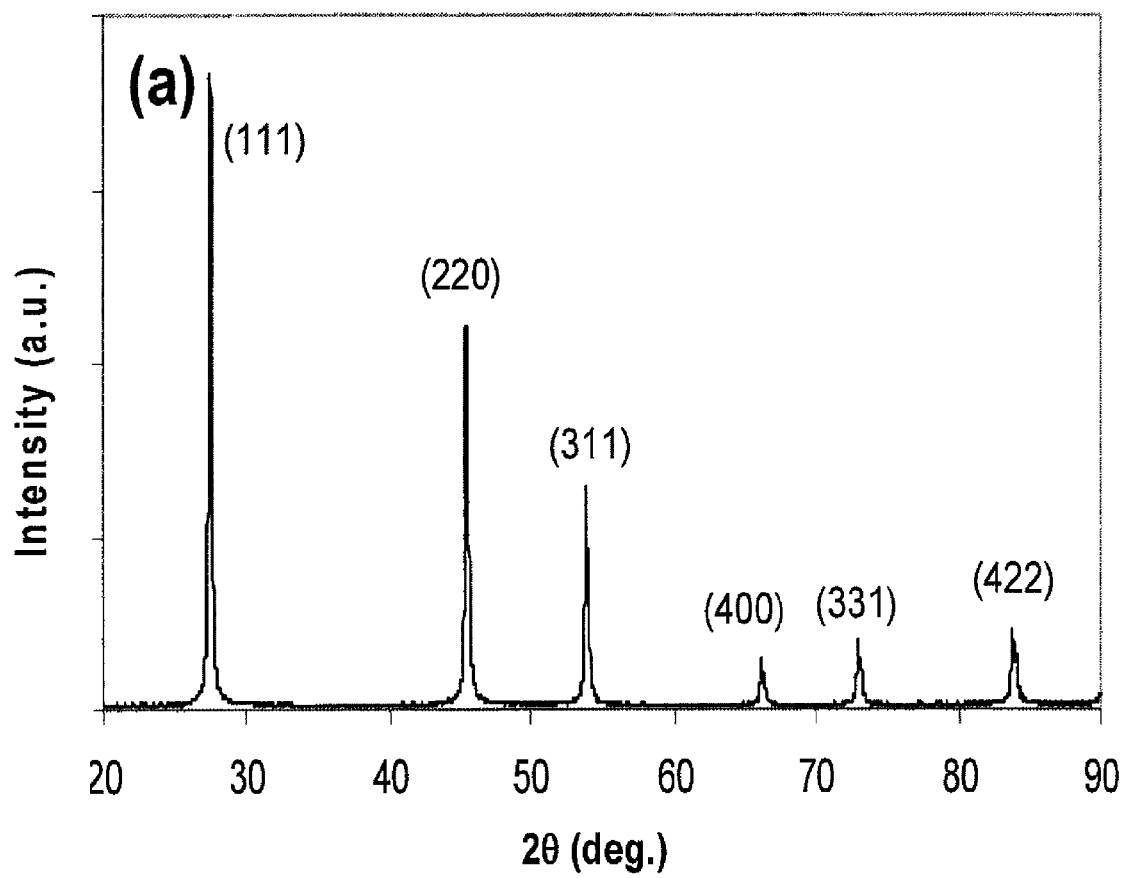
FIGS. 5a-5c characterize the reaction product by respectively powder x-ray diffraction (XRD), x-ray photoelectron spectroscopy (XPS) spectrum and thermogravimetric analysis in air (10° C./min heating rate)

Powder XRD measurements were performed to identify crystalline phases in the as-synthesized samples. FIG. 5a shows the XRD pattern obtained from sample Ge@MWCNT/800. The positions of the observed diffraction peaks (2θ=27.43, 45.45, 53.83, 66.13, 73.11, 83.79°) are in good agreement with literature values for the crystalline face centered cubic phase of Ge with lattice parameter a=5.660 Å. Furthermore, the neighbor interlayer spacing indexed in HRTEM images (see FIG. 3e) is approximately 3.29 Å, which is very close to the calculated distance between neighboring (111) planes of 3.27 Å. Thus the as-produced Ge@MWCNT/800 consists primarily of FCC Ge.

Figure 5B:
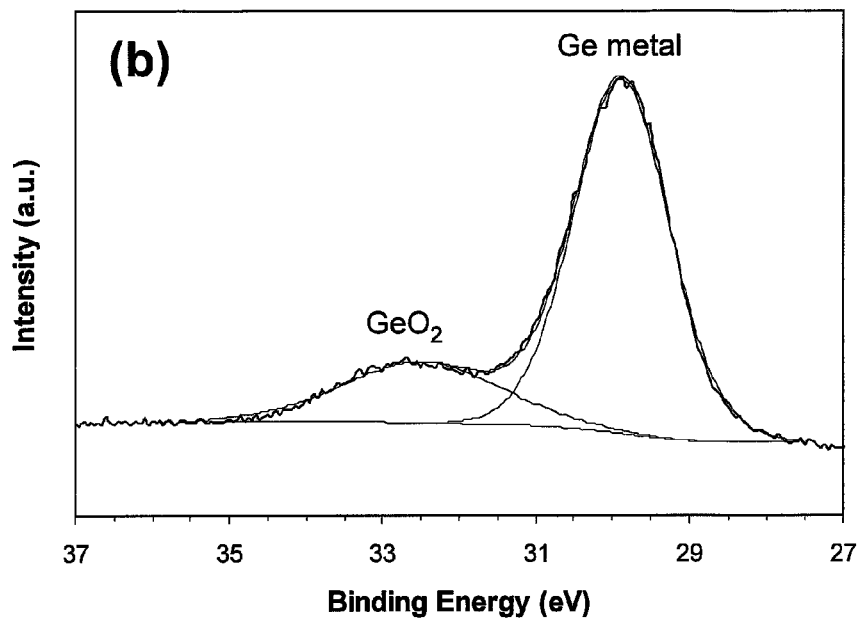
Figure 6A:
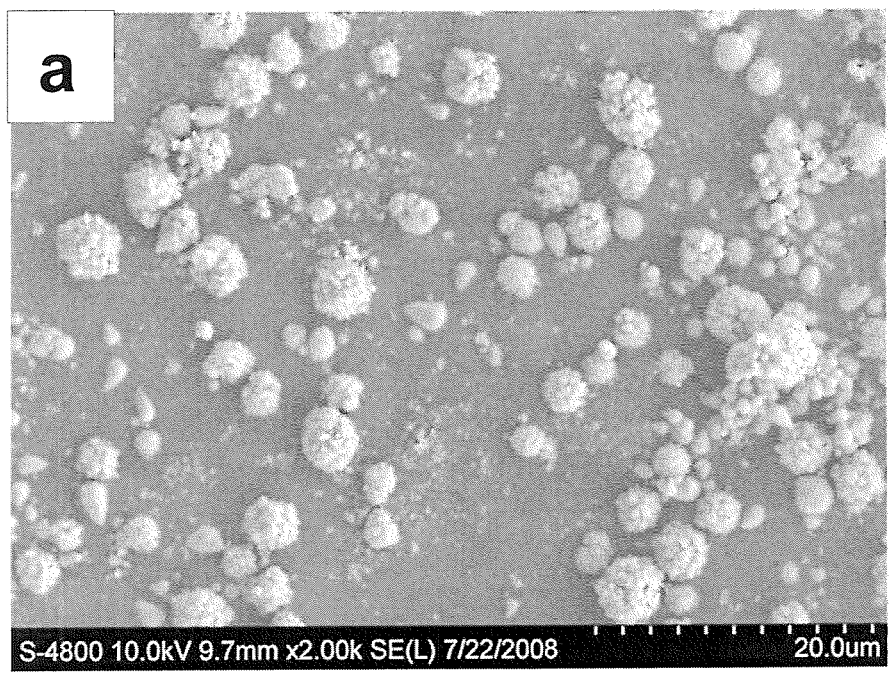
FIGS. 6a-6d are SEM images of reaction product using neat phenylmethylgermane starting material at, respectively 3, 4, 5 and 7 inches from the reactor inlet.
Figure 6C:
Figure 6B:

X-ray photoelectron spectroscopy (XPS) was used to study the oxidation state of the Ge in the nanowires. As shown in FIG. 5b, two Ge 3d photoelectron lines are observed. The signal corresponding to a binding energy of 29.7 eV can be assigned to Ge metal, albeit that it is slightly shifted (~0.3 eV) compared to typical 3d binding energies reported for bulk Ge[†]. This phenomenon has been observed previously and is attributed to the dimensional confinement of the Ge. The other signal at 32.5 eV is characteristic of $GeO_2$.[†] Deconvolution of the signals and integration indicates a Ge(0):Ge(IV) atomic ratio of 78:22, suggesting that the Ge nanowires are largely, although not completely, protected from oxidation. Additionally, it is likely that amorphous, partially oxidized Ge is present, which contributes to the $GeO_2$ signal. While SEM analysis of Ge@MWCNT/800 suggests that nanowires constitute at least 80% of the sample, the presence of irregularly shaped Ge particles can be observed in some SEM images (as shown in FIG. 6c).

[†] NIST Standard Reference Database 20, Version 3.4 (Web Version), http://srdata.nist.gov/xps/.

Figure 5C:
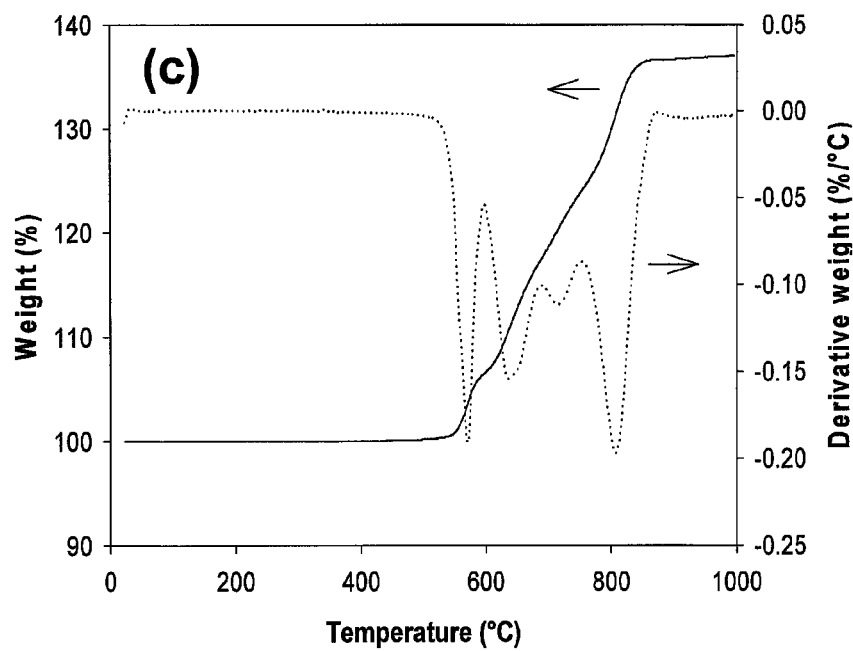

The results of thermogravimetric analysis performed on Ge@MWCNT/800 in air are shown in FIG. 5c. Noteworthy is the observation that a pronounced increase in sample weight commences at around 550° C., consistent with the oxidation of Ge to $GeO_2$. This temperature corresponds to the initiation of MWCNT combustion, suggesting that Ge oxidation proceeds as the nanowires' outer carbon shells are oxidized and the Ge cores are exposed. Allowing for the initial carbon content of 3 wt. % in the sample (by elemental analysis), and assuming that all of the Ge present is oxidized to $GeO_2$, the observed gain in sample weight (37%) corresponds to an initial molar Ge:$GeO_2$ ratio of 86:14 (in reasonable agreement with the value determined by XPS).

Figure 6D:
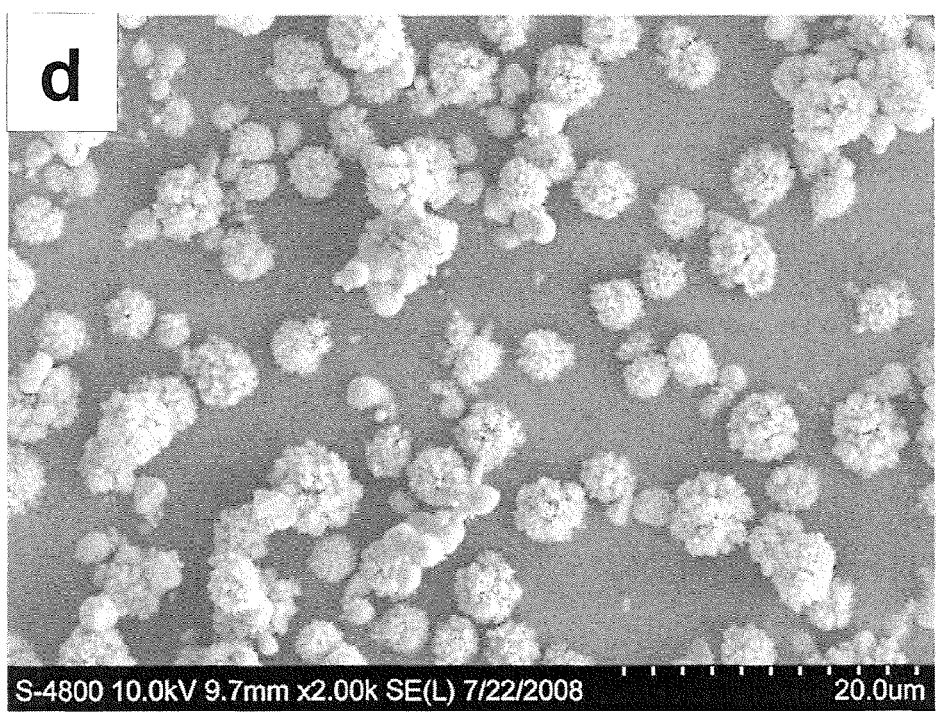
Figure 7A:
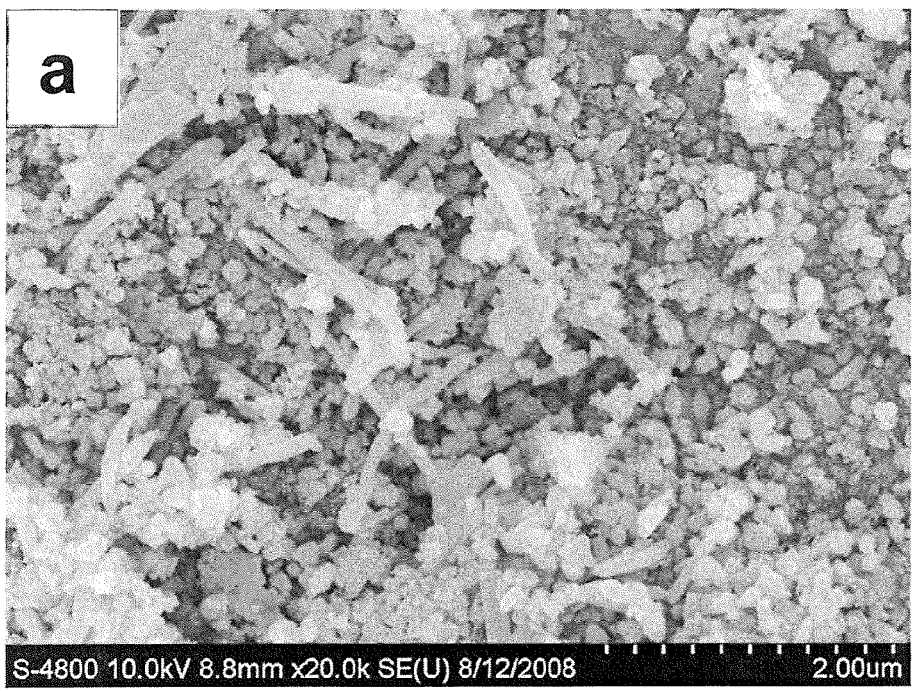
FIGS. 7a-7d are SEM images of the reaction product obtained using 50 weight percent phenylmethylgermane in xylene as the starting material at, respectively, 3, 4, 5 and 7 inches from the reactor inlet.
Figure 7C:
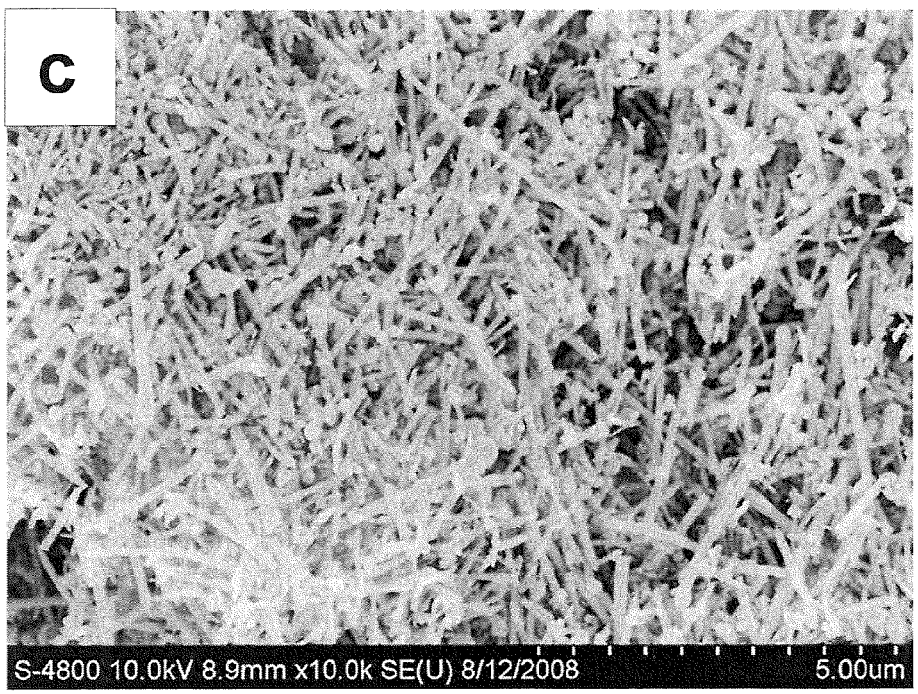
Figure 7B:
Figure 7D:
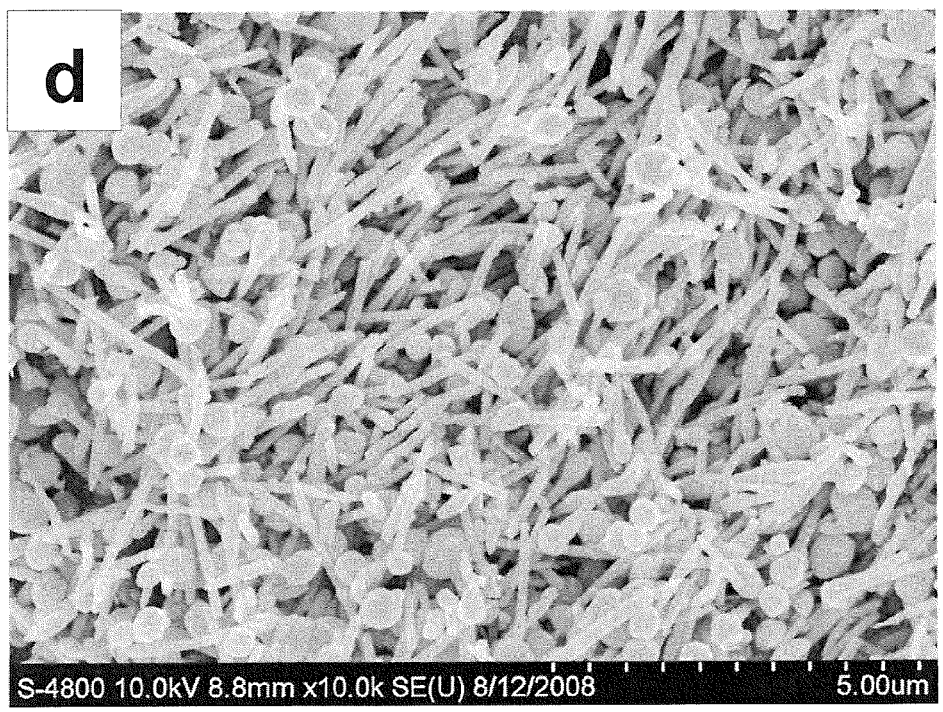

In order to provide insight into the factors controlling nanowire formation, CVD experiments were performed in which the deposited solid was sampled from quartz slides placed at fixed distances from the inlet, i.e., along the length of the tube reactor. The reaction zone was again held at 800° C. SEM images of these materials are shown in FIGS. 6 and 7. Images 6a-6d correspond to a CVD run performed using neat PTMG as the precursor, while images 7a-7d correspond to the product obtained using PTMG diluted to 50 wt % with xylene. For both runs, light deposits of mainly amorphous Ge particles were obtained closest to the inlet. For the run using neat PTMG, nanowires could be found in a localized region of the reactor, between 4" and 5" from the inlet. Further away from the inlet, Ge particles were obtained (FIG. 6d). Evidently, while carbon is available beginning at 4" from the inlet from cracking of the PTMG, the partial pressure of carbon in the atmosphere is insufficient to produce Ge-filled nanotubes along the entire length of the reactor. In contrast, when the PTMG/xylene mixture was used, not only was the total yield of Ge-filled nanotubes increased (estimated at >50% based on Ge), Ge-filled nanotubes were observed in the entire region 4"-7" from the inlet.

Furthermore, the dimensions of the filled nanotubes were rather uniform, with diameters in the 200-300 nm range and lengths of 6-10 µm.

Figure 3C:
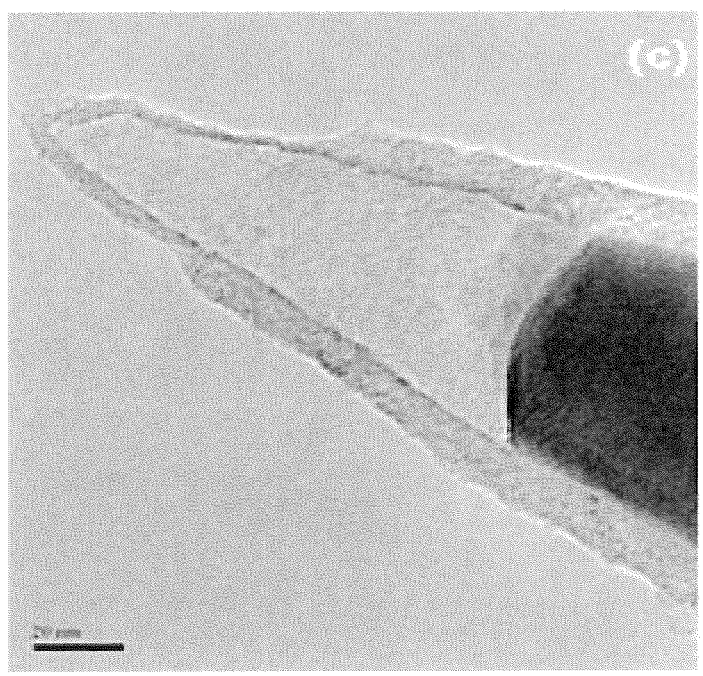
Figure 3B:
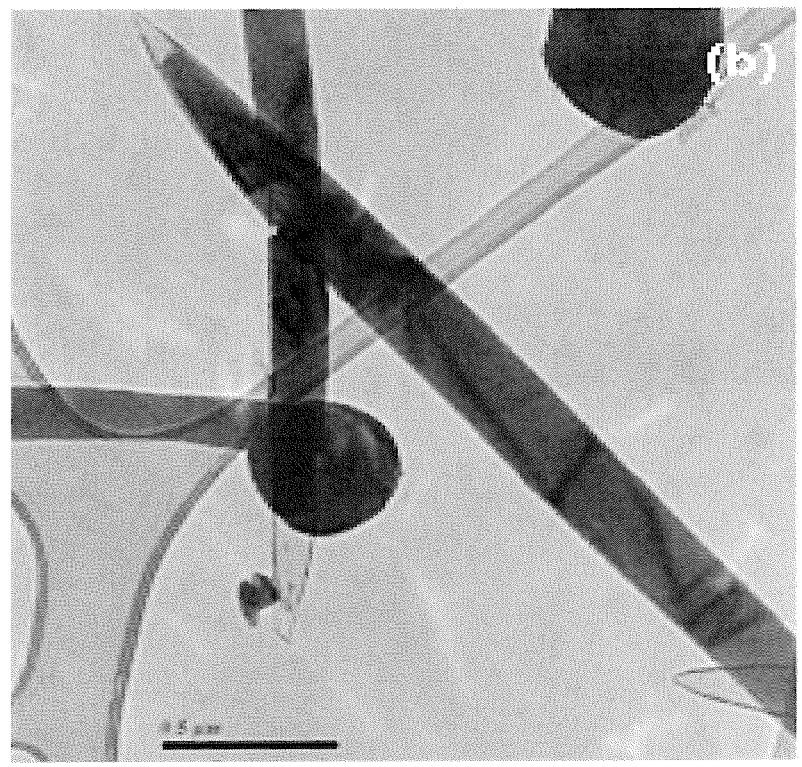
Figure 3D:
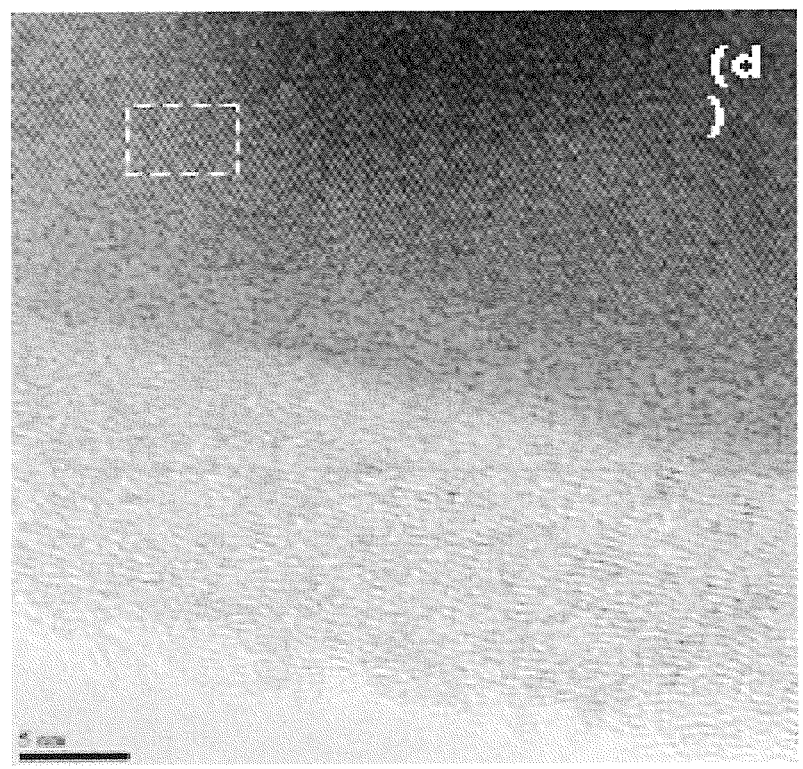
Figure 3E:
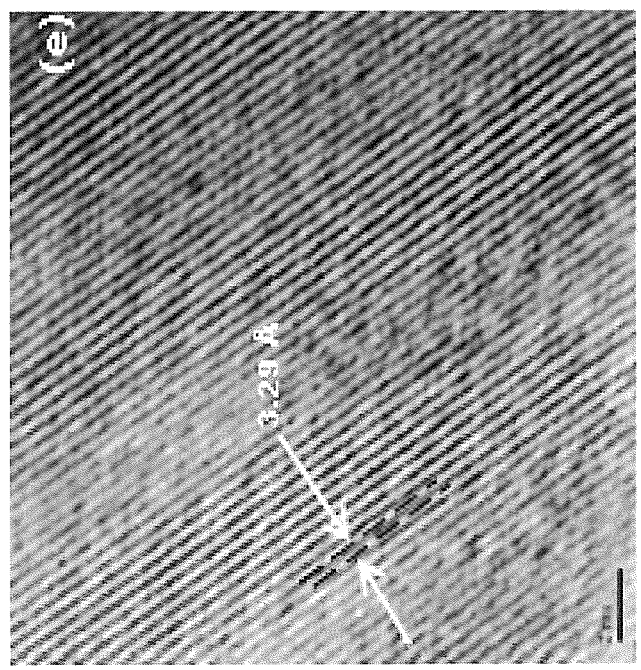
Figure 4B:
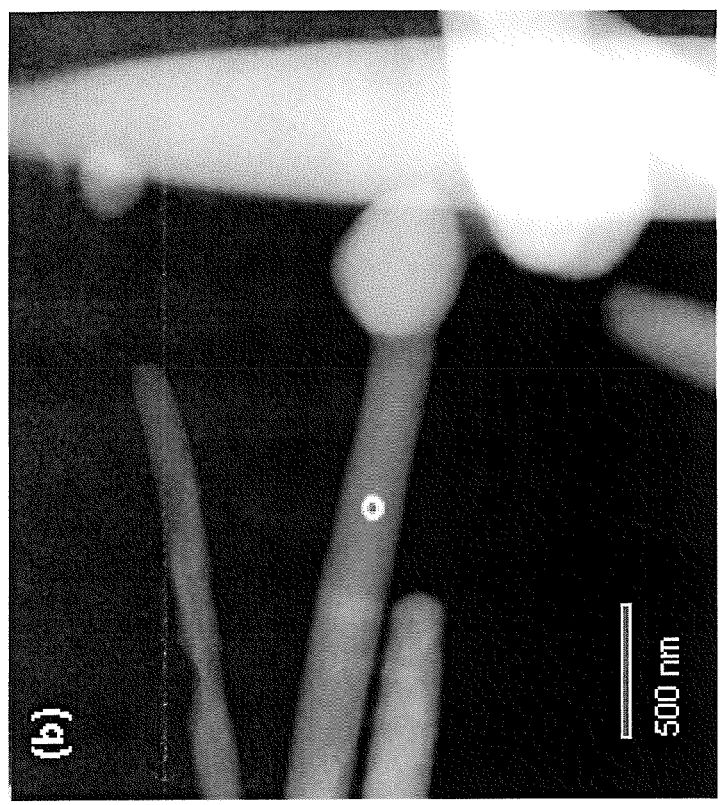
FIGS. 4a and 4b are scanning/transmission electron micrograph (STEM) images of the Ge-filled MWCNT reaction product shown in FIGS. 2a-2b and 3a-3e.
Figure 4A:
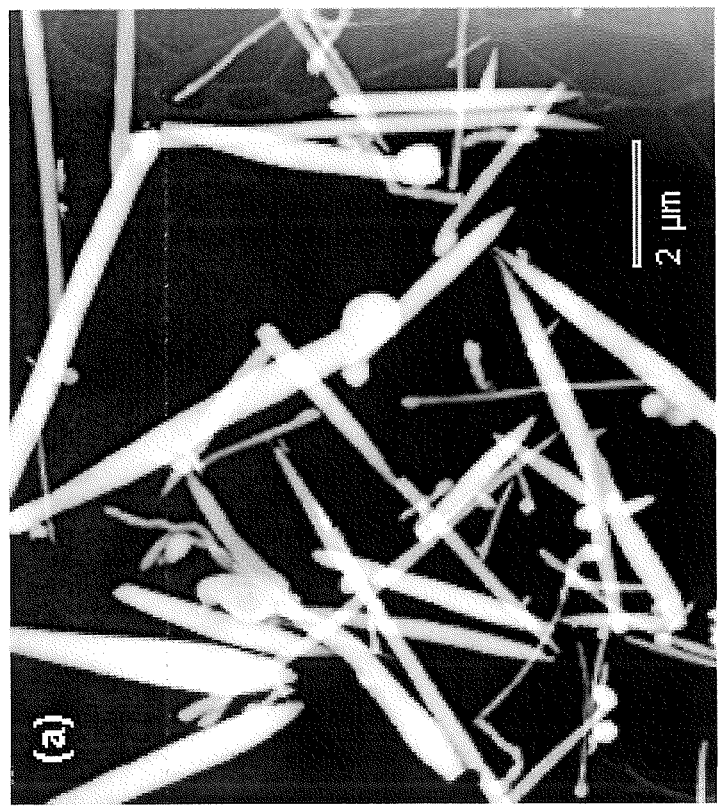
Figure 4C:
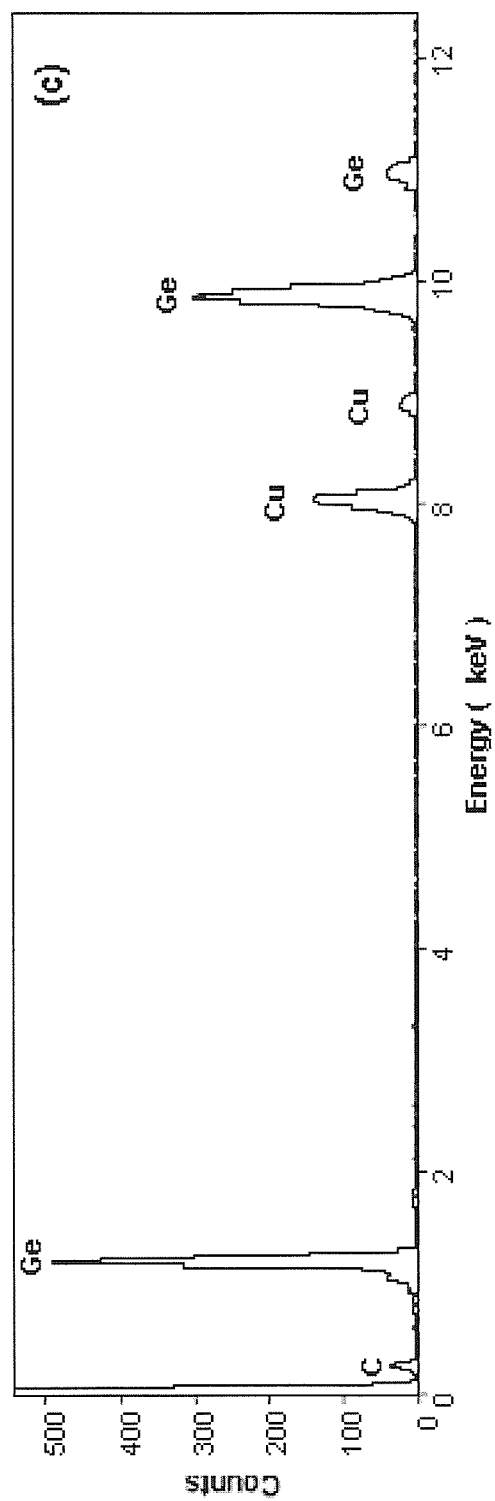
FIG. 4c shows the results of energy dispersive x-ray spectroscopy (EDS) for the reaction product in FIG. 4b.

For the runs performed with both neat PTMG and PTMG/xylene, structures could be observed which appear to correspond to the early stages of nanotube/nanowire growth. Examples of this are shown in the circled regions of FIG. 6b. CNT growth evidently occurs from the Ge particle and appears to carry Ge as a nanowire away from the initial particle. Presumably, this synthesis mode is the result of wetting at the interface of the Ge and the growing carbon nanotube. This is illustrated in FIG. 3c, 3d, which shows the high degree of association between the carbon sheath and the Ge nanowire. It should be noted that the synthesis temperature used (800° C.) was more than 100° C. lower than the melting point of Ge (938° C.). Differential scanning calorimetry (DSC) performed under $N_2$ indicates a m.p. of 934° C. for the Ge nanowires. While this is only slightly lower than the melting point for bulk Ge, it has been reported that smaller nanoscale metal structures can exhibit much greater melting point depression. Hence, melting point depression can be expected during the initial stages of nanowire growth. This effect, together with possible capillary action, can explain the apparently low Ge viscosity and the tendency for CNT filling by Ge.

This approach represents a simple method for the preparation of carbon-encapsulated Ge nanowires. The nanowires can be tailored to dimensions of 200-300 nm in diameter and 6-10 µm in length by selecting as CVD parameters a feed of 50 wt % PTMG in xylene and a process temperature of 800° C. These results may offer new possibilities for the application of Ge nanowires in micro-electronic devices.

Example 2

Using the apparatus described above, with AAO as the substrate, PTMG is fed to the CVD reactor at a rate of 1 ml/h, using $N_2$ as the carrier gas (at a flow rate of 750 cm$^3$/min) and a reactor temperature of 800-900 degrees C. These conditions are maintained for between 5 and 30 min, providing sufficient time for MWCNT sheaths to form on the channel walls of the AAO. After this period has elapsed, the carrier gas is switched to 10% $H_2$/Ar (750 cm$^3$/min flow rate), while maintaining a PTMG injection rate of 1 ml/h. This results in the formation of Ge-nanowires in the preformed MWCNT sheaths. Typically PTMG injection into the $H_2$/Ar carrier gas is maintained for at least 2 hours, resulting in the formation of long (50 µm) encapsulated nanowires.

The foregoing description of the preferred embodiments of the present invention have been presented for purposes of illustration and description. It is not intended to be exhaustive or to limit the invention to the precise form disclosed. Obvious modifications or variations are possible in light of the above teachings. Dopants other than iron may be used. Thus, one could mix the phenyltrimethylgermane (PTMG) with precursors of other metals or metalloid elements so as to introduce a range of metal dopants into the germanium. The metal dopant precursor used should be miscible with or soluble in the PTMG or PTMG solution. The metal dopant should undergo thermal decomposition at a temperature above the temperature at which the injection is performed (ca. 250 deg. C.) and below the reactor temperature (700-1,000 deg. C.). Further, the dopant should form a solid solution with germanium in the nanowires.

The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled. The drawings and preferred embodiments do not and are not intended to limit the ordinary meaning of the claims in their fair and broad interpretation in any way.

What is claimed:

1. A reaction product resulting from a process of growing germanium nanowires encapsulated within multi-walled carbon nanotubes;
said reaction product being characterized by comprising greater than 60 weight percent germanium nanowires encapsulated in multi-walled carbon nanotubes and less than 40 weight percent amorphous material in the absence of performing any purification step, wherein said multi-walled carbon nanotubes form a sheath having a thickness of about 5 to about 10 nm.

2. The reaction product of claim 1, wherein said reaction product is characterized by comprising greater than 70 weight percent germanium nanowires encapsulated in multi-walled carbon nanotubes and less than 30 weight percent amorphous material in the absence of performing any purification step.

3. The reaction product of claim 1, wherein said reaction product is characterized by comprising greater than 80 weight percent germanium nanowires encapsulated in multi-walled carbon nanotubes and less than 20 weight percent amorphous material in the absence of performing any purification step.

4. The reaction product of claim 1, wherein said reaction product is characterized by comprising greater than 90 weight percent germanium nanowires encapsulated in multi-walled carbon nanotubes and less than 10 weight percent amorphous material in the absence of performing any purification step.

5. The reaction product of claim 1, wherein said reaction product is characterized by comprising greater than 95 weight percent germanium nanowires encapsulated in multi-walled carbon nanotubes and less than 5 weight percent amorphous material in the absence of performing any purification step.

6. The reaction product of claim 1 wherein said nanowire has a length of between about 6 and about 50 µm and an overall diameter of between about 200 and about 300 nm.

7. The reaction product of claim 1 wherein said nanowire has a length of between about 10 and about 50 µm and an overall diameter of between about 200 and about 300 nm.

8. The reaction product of claim 1 wherein said nanowire has a length of between about 20 and about 50 µm and an overall diameter of between about 200 and about 300 nm.

9. The reaction product of claim 8 wherein said nanowire includes between about 95 and about 100 weight percent germanium and between about 5 and about 0 weight percent carbon.

10. The nanowire of claim 1 wherein said core includes between about 50 and about 99 weight percent germanium and between about 50 and about 1 weight percent iron.

11. A reaction product resulting from the process of:
performing chemical vapor deposition using a combined germanium and carbon source having a general formula of $GeR_{(4-x)}L_x$, where x=0, 1, 2, or 3; R is selected from a group consisting of alkyl, cycloalkyl or aryl and L=hydrogen, halide or alkoxide; and growing germanium nanowires encapsulated within multi-walled carbon nanotubes;

said reaction product being characterized by comprising greater than 60 weight percent germanium nanowires encapsulated in multi-walled carbon nanotubes and less than 40 weight percent amorphous material in the absence of performing any purification step wherein said reaction product has a germanium to carbon ratio of 5:1.

12. The reaction product of claim 1, wherein said reaction product has a germanium to carbon ratio of 9:1.

* * * * *